United States Patent
Foncubierta Rodriguez et al.

(10) Patent No.: US 12,124,958 B2
(45) Date of Patent: Oct. 22, 2024

(54) IDEMPOTENCE-CONSTRAINED NEURAL NETWORK

(71) Applicant: INTERNATIONAL BUSINESS MACHINES CORPORATION, Armonk, NY (US)

(72) Inventors: Antonio Foncubierta Rodriguez, Zurich (CH); Matteo Manica, Zurich (CH); Joris Cadow, Winterthur (CH)

(73) Assignee: International Business Machines Corporation, Armonk, NY (US)

( * ) Notice: Subject to any disclaimer, the term of this patent is extended or adjusted under 35 U.S.C. 154(b) by 1084 days.

(21) Appl. No.: 16/748,871

(22) Filed: Jan. 22, 2020

(65) Prior Publication Data

US 2021/0224656 A1    Jul. 22, 2021

(51) Int. Cl.
G06N 3/084 (2023.01)
G06F 17/16 (2006.01)
G06F 30/27 (2020.01)
G06N 20/00 (2019.01)

(52) U.S. Cl.
CPC ........... *G06N 3/084* (2013.01); *G06F 17/16* (2013.01); *G06F 30/27* (2020.01); *G06N 20/00* (2019.01)

(58) Field of Classification Search
CPC ........ G06N 3/084; G06N 20/00; G06F 30/27; G06F 11/1476; G06F 17/16
See application file for complete search history.

(56) References Cited

U.S. PATENT DOCUMENTS

| | | |
|---|---|---|
| 2014/0058991 A1 | 2/2014 | Harik |
| 2014/0222739 A1* | 8/2014 | Ponulak ............... G06N 3/049 706/25 |
| 2016/0071526 A1 | 3/2016 | Wingate et al. |
| 2017/0132512 A1 | 5/2017 | Ioffe |
| 2017/0228433 A1* | 8/2017 | Gartrell ............... G06F 3/0482 |
| 2019/0197670 A1 | 6/2019 | Ferrer et al. |
| 2019/0272309 A1* | 9/2019 | Chung ............... G06N 3/048 |

OTHER PUBLICATIONS

Moens, "Musical Style Transfer with Generative Neural Network Models," master's dissertation, Ghent U. (2019). (Year: 2019).*
Wikipedia, Idempotence, archive captured Dec. 21, 2019, http://web.archive.org/web/20191221060706/https://en.wikipedia.org/wiki/Idempotence. (Year: 2019).*
Bunne et al., "Learning Generative Models Across Incomparable Spaces", Proceedings of the 36th International Conference on Machine Learning, PMLR 97, May 15, 2019, 16 pages.
Burger et al., "Image denoising: Can plain Neural Networks compete with BM3D?", 2012 IEEE, pp. 2392-2399.

(Continued)

*Primary Examiner* — Ryan C Vaughn
(74) *Attorney, Agent, or Firm* — Anthony R. Curro

(57) ABSTRACT

A computer-implemented method for enforcing an idempotent-constrained characteristic during training of a neural network may be provided. The method comprises training of a neural network by minimizing a loss function, wherein the loss function comprises an additional term imposing an idempotence-based regularization to the neural network during the training.

15 Claims, 5 Drawing Sheets

(56) References Cited

OTHER PUBLICATIONS

Haynes, "Linear-scaling methods in ab initio quantum-mechanical calculations", A dissertation submited for the degree of Doctor of Philosophy at the University of Cambridge, Jul. 1998, 169 pages.

He et al., "Deep Residual Learning for Image Recognition", arXiv:1512.03385v1, Dec. 10, 2015, 12 pages.

Lecun et al., "The MNIST Database of handwritten digits", printed Jan. 7, 2020, 8 pages, http://yann.lecun.com/exdb/mnist/.

Xu et al., "Deep Convolutional Neural Network for Image Deconvolution", NIPS'14: Proceedings of the 27th International Conference on Neural Information Processing Systems—vol. 1, Dec. 2014, pp. 1790-1798.

Ronneberger et al., "U-Net: Convolutional Networks for Biomedical Image Segmentation", arXiv:1505.04597v1, May 18, 2015, 8 pages.

Wang et al., "Dilated Deep Residual Network for Image Denoising", 2017 International Conference on Tools with Artificial Intelligence, pp. 1272-1279.

Wang et al., "Orthogonal and Idempotent Transformations for Learning Deep Neural Networks", arXiv:1707.05974v1, Jul. 19, 2017, 10 pages.

\* cited by examiner

100

102 training of a neural network by minimizing a loss function 104 using an additional term imposing an idempotence-based regularization to the neural network

IDEMPOTENCE-CONSTRAINED NEURAL NETWORK

BACKGROUND

The invention relates generally to a method for training of a neural network, and more specifically, to a method enforcing an idempotent-constrained characteristic during training of a neural network. The invention relates further to a system for enforcing an idempotent-constrained characteristic during training of a neural network, and a computer program product.

Artificial intelligence (AI) and machine learning (ML) take the center stage of enterprise IT (information technology) interest. Neural networks play a central role in this shift from procedural programming to systems that are trained with training data, thereby abstracting and generalizing from individual cases. Thus, neural networks (NN) have been proposed as universal approximators of functions. Their ability to learn rather than formalize a transformation from multiple input-output pairs, and biasing the definition of the function, makes them suitable for a variety of applications. Formally, a neural network with parameters $\Theta$ approximates the function $f$ when it is trained with Pat examples of input (x) and output (x') signals. Due to the probabilistic approach and because the neural network training is subject to some training errors, there is no guarantee that $f_\Theta(x)$ is exactly x'. There is also no guarantee that all information of interest in x will be completely preserved by $f_\Theta(x)$.

SUMMARY

According to one aspect of the present invention, a computer-implemented method for enforcing an idempotent-constrained characteristic during training of a neural network may be provided. The method may comprise training of a neural network by minimizing a loss function. Thereby, the loss function may comprise an additional term imposing an idempotence-based regularization to the neural network during the training.

According to another aspect of the present invention, a system for enforcing an idempotent-constrained characteristic during training of a neural network may be provided. The system may comprise a neural network trainable by minimizing a loss function, wherein the loss function comprises an additional term imposing an idempotence-based regularization to the neural network during the training.

Furthermore, embodiments may take the form of a related computer program product, accessible from a computer-usable or computer-readable medium providing program code for use, by, or in connection, with a computer or any instruction execution system. For the purpose of this description, a computer-usable or computer-readable medium may be any apparatus that may contain means for storing, communicating, propagating or transporting the program for use, by, or in connection, with the instruction execution system, apparatus, or device.

BRIEF DESCRIPTION OF THE SEVERAL VIEWS OF THE DRAWINGS

Neural networks are frequently the state-of-the-art for inherently idempotent operations, such as image de-noising or signal convolution. However, most of the literature that proposes a neural network to perform such operations rely on minimizing a functional loss, implicitly assuming, that if the training of the network $f_\Theta$ is good enough, there is no need to further impose idempotence. However, this assumption does not hold even for a good approximation of the function.

It is therefore interesting to train a neural network in a way that, in addition to approximating the desired functional behavior, it also approximates an idempotent behavior, limiting the amount of information loss, so that a successive application of the neural network does not deteriorate too much. For example, if the desired functional behavior is noise reduction from images, it would be important that at the same time that the noises are removed, image information is kept so that if a clean image is given as input to the neural network, the output will not be noisier than the input.

Hence, there is a need for a method to enhance the behavior of a neural network and better reflect idempotence requirements at a global level of the neural network and independently from the network architecture.

It should be noted that embodiments of the invention are described with reference to different subject-matters. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present invention, are apparent from the examples of embodiments to be described hereinafter and are explained with reference to the examples of embodiments, but to which the invention is not limited.

Figure 1:

Preferred embodiments of the invention will be described, by way of example only, and with reference to the following drawings:

FIG. 1 shows a block diagram of an embodiment of the inventive computer-implemented method for enforcing an idempotent-constrained characteristic during training of a neural network.

Figure 2:
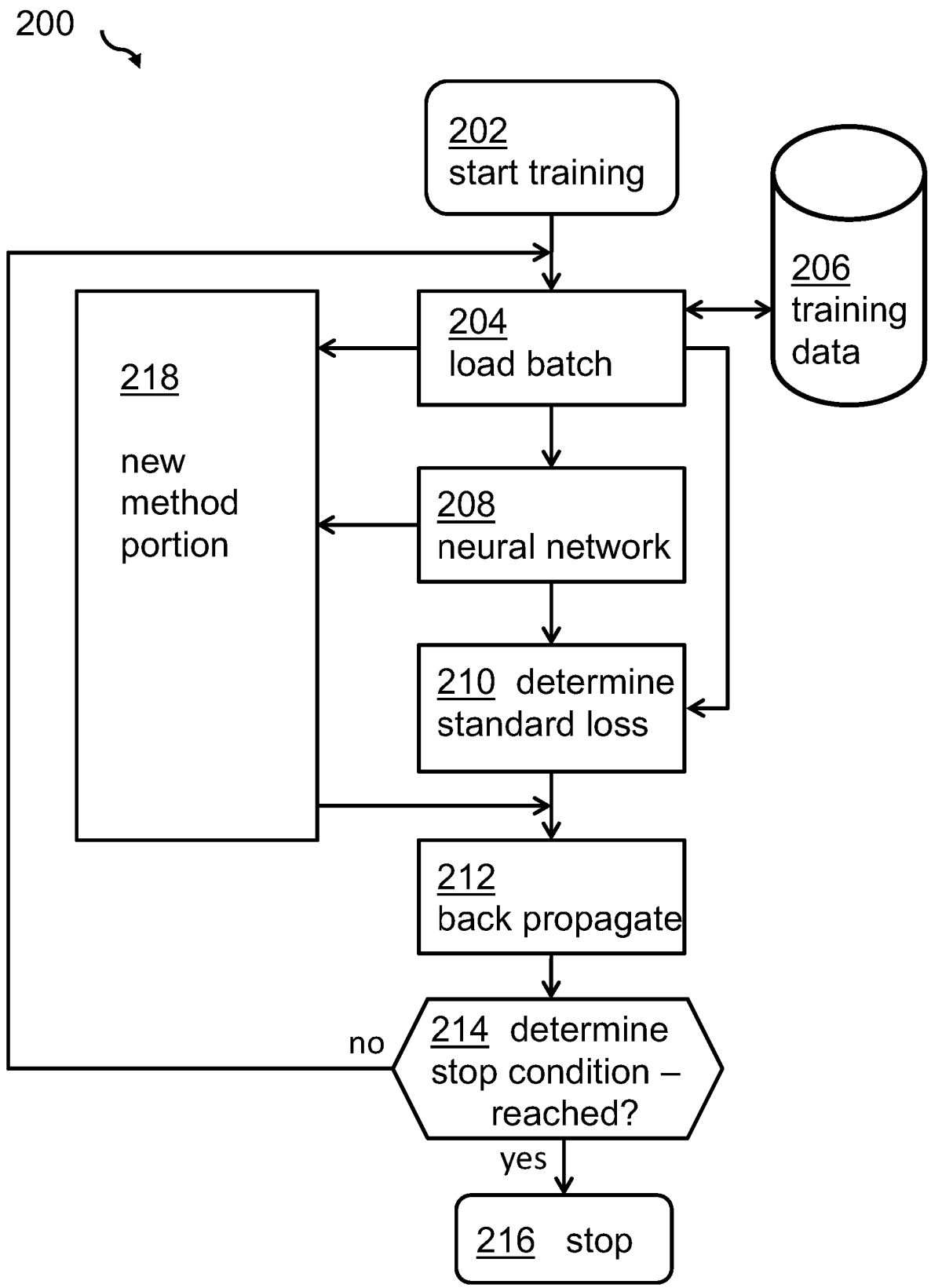

FIG. 2 shows a block diagram of an embodiment of the training process of the neural network.

Figure 3:
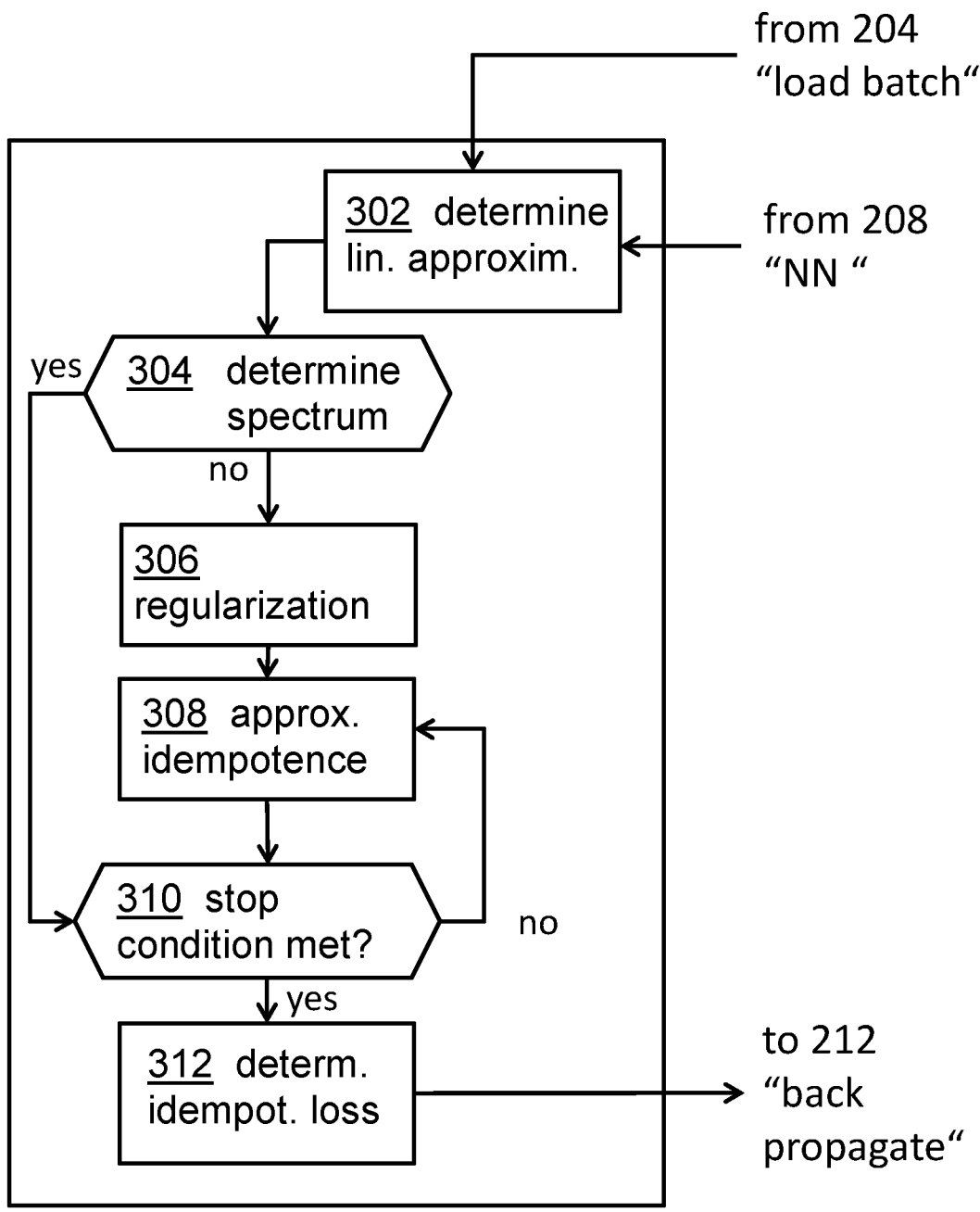

FIG. 3 shows a block diagram of an embodiment of the novel method portion of a determination of the additional term.

Figure 4:
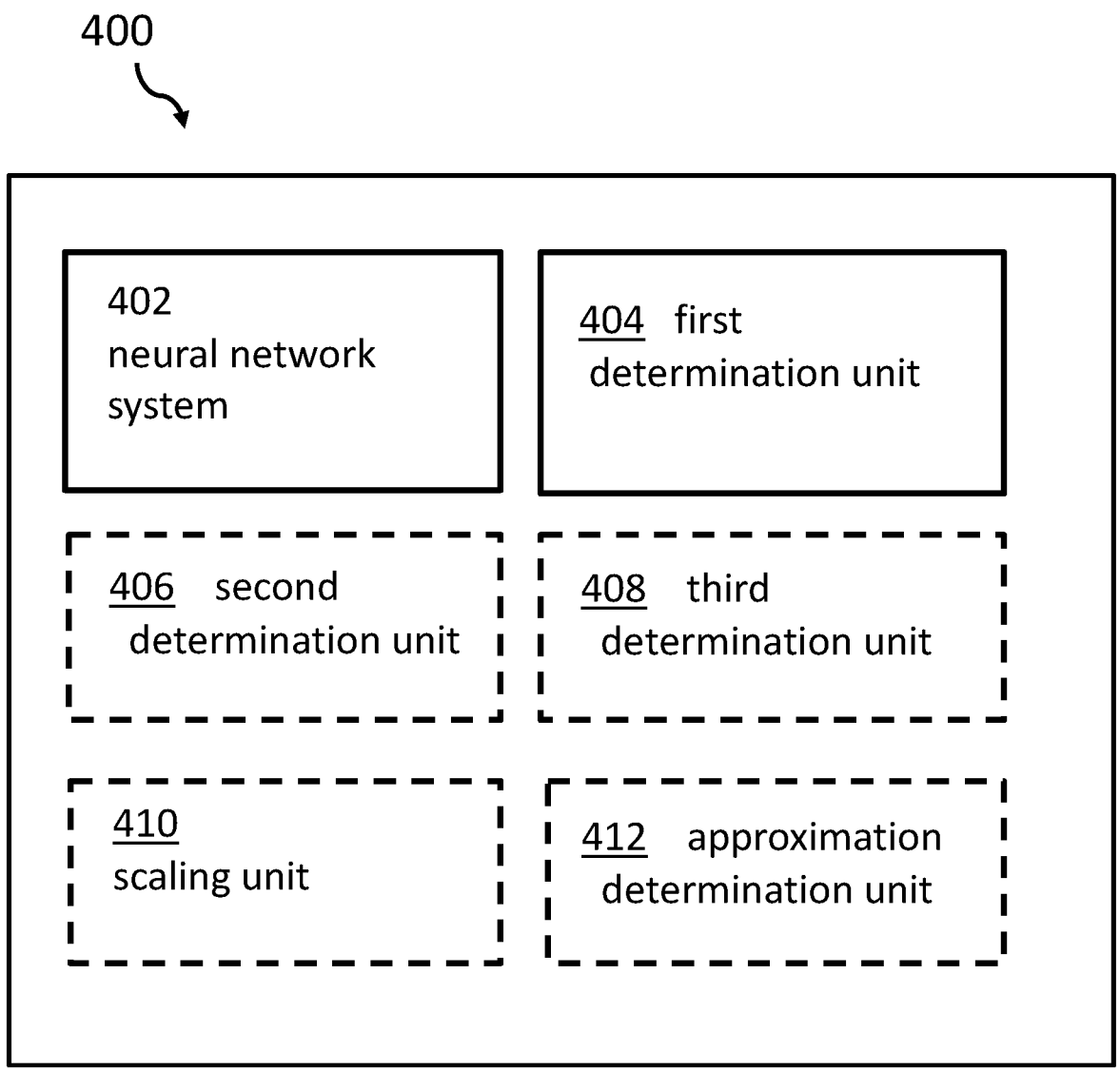

FIG. 4 shows an embodiment of the system for enforcing an idempotent-constrained characteristic during training of a neural network.

Figure 5:
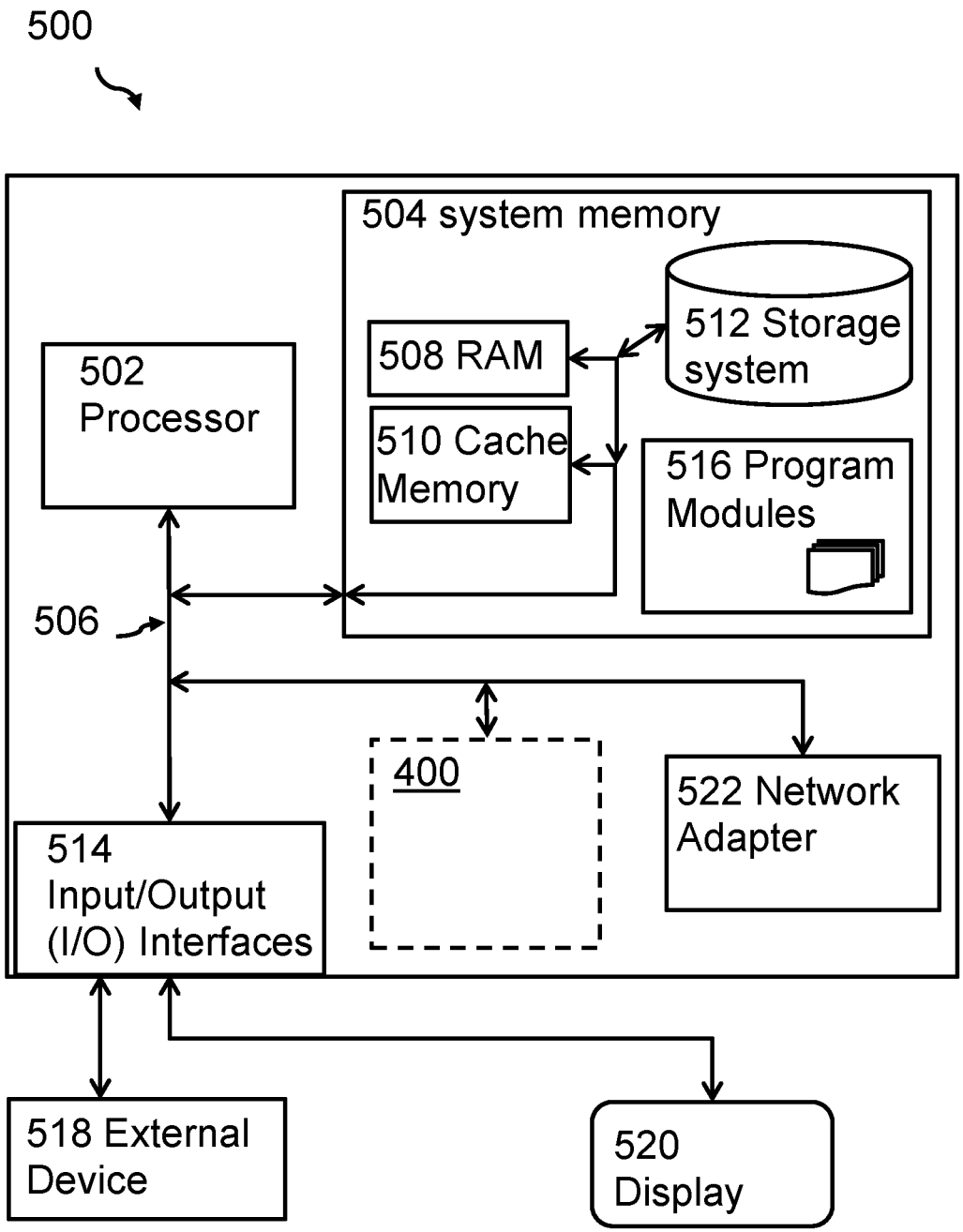

FIG. 5 shows an embodiment of a computing system comprising the system according to FIG. 4.

DETAILED DESCRIPTION

In the context of this description, the following conventions, terms and/or expressions may be used:

The term 'idempotence' may denote the property of a transformation, whereby operations which may be applied multiple times to input data without changing the results beyond the initial input data. Consequently, the term 'idempotent-constrained' may determine—in particular in the context of a training of a neural network—that input data may result in output data of the neural network which directly correspond to each other. This may, e.g., be used for a "de-noising" of sound input data or image input data. Hence, such a neural network may function as a "clarifier filter".

The term 'neural network' (NN)—in particular, artificial neural network (ANN)—may denote a computing system that is inspired by, but not identical to, biological neural networks comprising artificial neurons. Such systems may be trained to perform tasks by considering examples, generally without being programmed with task-specific rules. A plurality of artificial neurons, i.e., nodes, may be organized in a plurality of network layers: an input layer, one or more (for deep NNs) hidden layer(s) and an output layer. Often, neural networks are trained as classifier systems. However, for the here proposed concept, it may be assumed that the domain of the input data is identical or equivalent to the domain of the output data: sound data are transformed to sound data, image data are transformed to image data, etc.

The different nodes of the different layers may have connections—often denoted as edges—from one layer to the next layer and may carry a weight factor characterizing a signal amplification or signal damping. During training of the neural network, a loss function result may be minimized by a back propagation process, feeding back the output signals of the output layer of the neural network in order to—step by step—adjust the weight factors of the nodes within the different layers of the neural network.

The term 'loss function' may denote a function adapted for determining a difference between an input value and a desired output value of the function.

The term 'additional term' may denote another, additional term to the loss function which may ensure an idempotent characteristic of the transformation function of the neural network.

The term 'idempotence-based regularization' may denote an adjustment of the behavior of the neural network such that its characteristic is trimmed to an idempotent characteristic of the neural network. Thus, if the NN may be used as an instrument to remove noise from, e.g. an image, the idempotence behavior guarantees that the original image will not fade away. Only the noise will be reduced.

The term 'matrix of vectorized input data' may denote a matrix comprising the vectors of input data, wherein each input vector may comprise one training example. Images as training data may themselves be described as a matrix. In such a case, each row or each column of the matrix of the image may be stringed together building a single vector. A plurality of such stringed together vectors may build the matrix of vectorized input data. Thus, one may say that all training data may be put as a single batch in one matrix.

The term 'idempotent matrix' may denote a transformation matrix ensuring that has the property of idempotence, i.e. the product of an idempotence matrix (P) with itself (PP) results in the same matrix (P), i.e., $PP=P_\infty$ This may ensures that multiple applications of the same transformation on any vector are equivalent to applying the transformation once. If v is the vector, then $PPv=Pv$.

The term 'Jacobian matrix' may denote the matrix of all its first-order partial derivatives. If this matrix is square, i.e., if the function takes the same number of variables as input as the number of vector components of its output, both, the matrix and its determinant are referred to as the Jacobian.

The term 'spectral restriction' may denote that a related matrix may have only an allowed eigenvector within a predefined range.

The term 'scaling' may denote a multiplication with a mathematical real value. The factor may be above 1—i.e., scaling up—or below 1, i.e., scaling down.

The term 'Singular Value Decomposition' may denote a factorization of a real or complex matrix. It may denote the generalization of the eigendecomposition of a positive semi-definite normal matrix—e.g., a symmetric matrix with non-negative eigenvalues—to any m×n matrix via an extension of the polar decomposition.

The proposed computer-implemented method—and a related system—for enforcing an idempotent-constrained characteristic during training of a neural network may offer multiple advantages, contributions and technical effects:

The proposed concept may allow restricting a training of a neural network to an idempotent behavior or characteristic at a global level—i.e., from the input layer to the output layer—of the neural network. This may imply that such an idempotent characteristic may not only be achievable from one layer of a neural network to another layer but across the complete neural network from the input layer to the output layer.

Thereby, it may be assumed that the domain of the input data is identical or equivalent to the domain of the output data of the neural network.

The proposed concept may be applied without any restrictions to any neural network. Thus, no additional constraints may have to be applied to the definition of the neural network. In particular, the proposed concept may be independent of the architecture of the neural network. The proposed concept is also independent of the dimensionality or type of input data.

The here proposed method is also adapted to show a fast convergence to the iterations to find a usable idempotence matrix, and it generalizes the concept of preserving information after successive applications.

Thus, a generalized concept for preserving information after successive applications of a neural network function to input data has been successfully be developed.

In the following, additional embodiments—applicable to the method as well as to the related system—will be described:

According to one advantageous embodiment of the method, the additional term $\mathcal{L}_\Theta^{P+}(X)$ may be determined by:

$\mathcal{L}_\Theta^{P*}(X)=\| X'-XP^*=f_\Theta(X)-XP^*\|$, wherein

X=a matrix of vectorized input data for the neural network,

X'=a matrix of vectorized output data of the neural network, $f_\Theta$=neural network function with network parameters.

P*=idempotent matrix that maps X to $f_\Theta(X)$ with a close—in particular, the closest—approximation that may constrain the mapping to idempotence, and $\| \ldots \|$ is the norm. This may be, e.g., the square norm or the Frobenius norm. The Frobenius norm or Schurnorm is a matrix norm based on the Euclidian norm.

It may be noted that the matrix of input data may comprise a complete batch of input data, for example, if the input data comprise images, the pixel information of the images may be vectorized, i.e., each input vector of an image pixel matrix may be stringed together one after another. All such vectorized images may then build the matrix of input data. This principle may also be applicable for other higher dimensional tensor data as input data.

Furthermore, it may be assumed that the domain of the input data vector is equivalent to the domain of the output vector. Thus, an image as input data remains an image as output data. Hence, the neural network is not used as classifier but more as a signal filter.

Additionally, it may be understood that the network parameters are the network hyper-parameters in a broad sense including, e.g., individual weights of the nodes, number of layers, connections between the nodes, etc., simply all parameters of the neural network.

According to another advantageous embodiment, the method may also comprise determining the idempotent matrix P* by determining a linear approximation of the network function. According to a further embodiment, the method may also comprise determining the linear approximation using an inverse or pseudo-inverse matrix—which may be more flexible and not constrained to a specific matrix form only of the input data, i.e., the matrix, or using the Jacobian matrix of the neural network function $f_\Theta$. Thus according to the type of input data, different partial methods may be applied.

According to a further advantageous embodiment, the method may also comprise determining if the linear approximation complies with spectral restrictions—i.e., the matrix may need eigenvectors in a given range—of idempotent matrices or, matrices that can be approximated to idempotence. Examples of eigenvectors may lie in the range of −0.5 to 1.5.

According to one advanced embodiment, the method may comprise: upon determining that the linear approximation does not comply with spectral restrictions of idempotent matrices, scaling singular values of a Singular Value Decomposition of the linear approximation. Thereby, a regularization step on the linear approximation may be performed. By 'scaling' an up or down scaling may be meant, i.e., a multiplication with real values smaller or larger than 1.

According to one concrete embodiment, the method may also comprise obtaining—in particular iteratively—an approximation to $f_\Theta$ that is more idempotent than the previous one determined by:

$$P_{i+1} = P_i^2(3-2P_i)$$

until a stop condition is met. The stop condition may suppress an infinite loop.

In other words, if starting with a matrix $P_0$ the scaling will result in P*. The test for the stop condition will again be performed with P*, and if the test may result in an error between the input data and the output data which is below a predefined threshold value, a good enough idempotence matrix is found.

It may be noted that two sub-processes may be involved: (i) firstly, it is determined that the approximation to idempotence can be made idempotent (by checking and scaling the spectral properties) and (ii) secondly, an iterative process that will actually achieve idempotence in a few iterations from the point where step (i) left.

This is important because it may ensure a fast process, and it may allow having the matrix determination inside the training loop.

Hence, once it is guaranteed that the spectral restriction is met, nothing may have to be re-determined. If $f_\Theta$ is a non-linear neural network function and the determined linear idempotent matrix P is compliant with the spectral restrictions, $P_0$ is a linear approximation after the scaling; if required, further $P_1, P_2, \ldots, P^*$ iterations are done until P* emerges as the linear approximation of $f_\Theta$ that is also idempotent.

According to one further enhanced embodiment, the method may also comprise: upon determining that the linear approximation complies with spectral restrictions and idempotence—i.e., meeting a stop condition, i.e., an error below a threshold value—feeding the additional term back to a back-propagation step of the training of the neural network. With this, the additional term may be used as the normal training back-propagation step of the regular training of the NN.

According to an optional embodiment of the method, the idempotent regularization may be a Procrustes-based regularization, i.e., a regularization being based on principles of Procrustes analytics, i.e., finding out an optimal rotation and/or reflection (i.e., the optimal orthogonal linear transformation) for a Procrustes-Superimposition of one object to another. This will lay the basis for the idempotence characteristic.

According to one preferred embodiment of the method, the domain of an input vector to the neural network may be equivalent to a domain of the output vector of the neural network. The input and the output data may relate to image data, sound data, etc. Hence, the neural network may be used as a filter instead of a classifier.

Before going into a detailed figure description, a theoretical basis of the here proposed concept shall be discussed.

Given a set of $X \in \mathbb{R}^{m \times n}$ of m samples $x_i \in \mathbb{R}^p$ with associated filtered examples $X' \in \mathbb{R}^{m \times p}$ one may consider the problem of finding the optimal idempotent mapping $f(X) = X'$. This mapping may be modeled as a neural network $f_\Theta$ depending solely on $\Theta$ parameters. The optimization of the parameters is commonly performed by different flavors of gradient descent approaches by minimizing, e.g., the loss function on the Frobenius norm F:

$$\mathcal{L}_\Theta^F(X, X') = \|f_\Theta(X) - X'\|_F^2$$

Although this approach may ensure to find an accurate approximation of the function $f_\Theta$, it does not guarantee the idempotence of the transformation $f_\Theta$.

A naïve approach to this dilemma may be addressed by constraining the optimization by adding a term to the loss function that forces the network to leave the filtered example unchanged:

$$\mathcal{L}_\Theta'(X') = \|f_\Theta(X') - X'\|_F^2$$

This term may impose a strong requirement of learning an identity mapping when the input is the target. While this constraint, at the optimum, may guarantee the idempotence of the transformation $f_\Theta$, it might hinder the ability to learn a complex transformation.

Instead, based on imposing global network orthogonality, it is proposed to address this issue by relaxing the optimization problem using a looser constraint:

$$\mathcal{L}_\Theta^{P+}(X') = \|f_\Theta(X') - XP^*\|_F^2.$$

Thereby, P* may represent an idempotent matrix that maps as accurately as possible X to $f_\Theta(X')$:

$$P^* = \text{argmin}\{P \in \mathbb{R}^{p \times p} | P^2 = PP = P\} \qquad \text{(Eq. A)}$$

$$P \in I(p)$$

This last term may impose a Procrustes-based regularization at global scale to the neural network without any restriction on the network architecture, making the approach extremely versatile.

Estimation of P*

Introducing the term $\mathcal{L}_\Theta^{P+}$ represents the problem of solving during each loss evaluation and optimization problem with no analytical solutions. Since at each mini-batch step one needs to determine the loss, it is mandatory to find an efficient way to approximate P* via an iterative model.

It is possible to show that the non-idempotent matrix $P_0$ may be reduced to a close idempotent one using a rapidly converging sequence. Thereby, one can reduce to 0 the matrix $P_0^2-P_0$ by minimizing the semi-definite scalar tr $((P_0^2-P_0)^2)$ by computing its derivative:

$$\frac{tr((P_0^2-P_0)^2)}{(P_0)_{ij}} = [2P_0(P_0-1)(2P_0-1)]_{ji}$$

One can also show that the steepest descent method defines a rapidly converging sequence:

$$P_{n+1}=P_n^2(3-2P_n), \quad \text{(Eq. C)}$$

Wherein the limit $P_\infty$ and its idempotence is close to $P_0$ in the following sense:

$$tr((P_\infty-P_0)^2) \ll tr(P\infty) < p.$$

Given the quadratic order of the convergence of the sequence, one can follow the steepest descent for a few steps to get a reasonable approximation of $P_\infty$. By analyzing the sequence, one can recover a convergence condition on the spectrum of $P_0$.

The following theorems can be formulated:
Consider a square matrix $P_0$ and its eigenvalues $\lambda(P_0)$. If all the eigenvalues satisfy the condition:

$$-\tfrac{1}{2} \leq \lambda_i(P_0) \leq \tfrac{3}{2} \quad \forall i=1,\ldots,p$$

The eigenvalues $\lambda(P_\infty)$ of $P_\infty$, the limit of the sequence defined in Eq. B, satisfies:

$$0 \leq \lambda_i(P_\infty) \leq 1 \quad \forall l=1,\ldots,p$$

Proof. One may start by defining:

$$B_P(a,b)=\{a \leq \lambda_i(P) \leq b \forall_i=1,\ldots,p\}$$

Additionally, one defines $1_b=-\tfrac{1}{2}$ and $u_b=\tfrac{3}{2}$. Consider now Eq. B in the case n=0:

$$P_1=P_0^2(3-2P_0)$$

Following Haynes (1998) (compare: Peter David Haynes. Linear-scaling methods in ab initio quantum-mechanical calculations. PhD thesis, University of Cambridge, 1998. URL: www.tcm.phy.cam.ac.uk) it is straightforward to show that:

$$B_{P0}(l_b, u_b) \Rightarrow B_{P1}(0, 1)$$

Since by definition, for every n the following holds:

$$B_{Pn}(0,1) \subset B_{Pn}(1_b, u_b)$$

one can trivially prove by induction that:

$$B_{P0}(1_b, u_b) \Rightarrow B_{P\infty}(0, 1)$$

The above represents an efficient way to determine an idempotent projection of a matrix. The only thing remaining is finding a good starting point for the iterative schema. To serve this purpose, a candidate $P_0'$ should minimize $\|f_\Theta(X)-XP_0\|_F^2$ and it has to be fast to be determined.

It may be noted that the quantity is minimized by setting $\overline{P_0}=X^+f_\Theta(X)$, where the pseudoinverse can be efficiently computed using SVD. Still, one has no guarantees on the spectral properties of the candidate $P_0$. Therefore, it is proposed to define $P_0$ by scaling the singular values of the candidate $P_0$:

$$P_0=U\Sigma_b V^*, \quad \text{(Eq. D)}$$

wherein $[\Sigma_b]_{ij}=[\Sigma]_{ij}/2\sigma_1(P_0)$ and $\overline{P_0}=U\Sigma V^*$.

At this point, it is possible to prove the following theorem:

Theorem 1

Consider the matrix $P_0$ defined in Eq. D. All its eigenvalues satisfy the condition:

$$|\lambda_i(P_0)| \leq 1/2 \forall i=1,\ldots,p.$$

Proof Start by observing that for any square matrix $P \in \mathbb{R}^{p \times p}$ and any vector $v \in \mathbb{R}^p$, the following holds:

$$|Pv|=|U\Sigma V^*v|=|\Sigma V^*v| \leq \sigma_1(P)\|V^*v\|=\sigma_1(P)\|v\|.$$

The same applies to any eigenvector and one obtains:

$$|\lambda_i(P)|\|v\| \leq \sigma_1(P)\|v\| \Rightarrow |\lambda_i(P)| \leq \sigma_1(P) \forall i=1,\ldots,p$$

Since, by construction, the largest singular value of $P_0$ is $\sigma_1(P_0) \leq 1/2$, one immediately recovers the condition on the spectrum stated in the theorem.

Thanks to Theorem 1, one now has a $P_0$ with suitable properties that can be used to find P* for each batch and compute $\mathcal{L}_\Theta^{P*}$.

To demonstrate the feasibility, an experiment on MNIST (Yann LeCun. The MNIST database of handwritten digits. 1998, URL: yann.lecun.com) has been conducted. Idempotence of the network approximation was tested on a random MNIST batch. The experiment was set up as follows:
A random batch is taken as a target $X' \in \mathbb{R}^{m \times p}$,
A Gaussian perturbation is added to X' to generate noisy examples $X \in \mathbb{R}^{m \times p}$,
It is further assumed to have a network trained, simulated by adding a fraction of a Gaussian perturbation with the same magnitude of the one used to generate X. The leaky denoiser is $f_\Theta(X)$.

One applies the procedure described in the previous section to find P*, an idempotent approximation of $f_\Theta(X)$ using one iterative step of Eq. A. It may easily be understandable how different transformations change the examples in a given batch of the MNIST data. So it becomes evident how the idempotent approximation is deviating from the original network approximation, but it's interesting to observe how the information about the predominant signal (the digit) is preserved, and how the noise removal effect of the network is still present. An analysis of multiple applications of the filter on the input and a comparison of $P_0'$, $P_0$ and P* may also show the power of the here proposed concept.

In the following, a detailed description of the figures will be given. All instructions in the figures are schematic. Firstly, a block diagram of an embodiment of the inventive computer-implemented method for enforcing an idempotent-constrained characteristic during training of a neural network is given. Afterwards, further embodiments, as well as embodiments of the system for enforcing an idempotent-constrained characteristic during training of a neural network, will be described.

FIG. 1 shows a block diagram of a preferred embodiment of the computer-implemented method 100 for enforcing an idempotent-constrained characteristic during training of a neural network. This characteristic is independent from the network architecture, i.e., independent from the network structure and the dimensionality of the input data. This characteristic is in particular valid on a global level of the neural network, i.e., across all layers and not for one or a few layers only. The method 100 comprises training, 102, of a neural network by minimizing a loss function. This can be a standard loss function, e.g., a min-square error function, a min-absolute-error function, a binary-cross-entropy algorithm, and the like. The loss function comprises also using, 104, an additional term imposing an idempotence-based regularization to the neural network during the training. It may again be emphasized that the idempotence-based regularization does not apply to only parts of the layers of the neural network but the complete network.

FIG. 2 shows a block diagram 200 of an embodiment of the training process of the neural network (not shown). After the start 202 of the training the input data are loaded, 204, from a storage of training data 206. The data—in particular in batch mode—are applied, 208, to the neural network and a standard loss function result is determined, 210, by also referring to the input data.

The batch of input data is transferred to the novel method portion 218—relating to the additional term—which in turn delivers the result of the additional term determination as additional input to the back propagation process 212 of the main process flow. If a determined stop condition is not reached—reference numeral 214 (case "no")—the flow goes back to the start of the process; otherwise (case of "yes"), the process stops (reference numeral 216).

FIG. 3 shows a block diagram of an embodiment of the novel method portion 218 of a determination of the additional term. This novel method portion 218 describes an efficient partial method to approximate P*, which is initially unknown. Input for this method portion 218 comes from the main process described in FIG. 2 from the process steps "load batch" 204 and "neural network" 208. The result of the determination in the method portion 218 is delivered back to this step "back propagate" 212 of the main process flow according to FIG. 2. As additional input to the new method portion 218, all parameters of the neural network are used.

As a first activity, a linear approximation to the network function $f_\Theta$ is obtained, 302. Here, two ways are possible: using an inverse of pseudo-inverse of the input data or using the Jacobian of the network function as linear approximation.

Then it is determined, 304, whether the determined linear approximation complies with the spectral restrictions of idempotent matrices (i.e., whether the eigenvalues lie in a specific range). In that case, the process proceeds to a determination 310 if the matrix is already idempotent (stop condition met, 310). If that is the case—case "yes"—the determined idempotent loss is determined 312, and fed back to the main flow (compare FIG. 2, 212).

If the linear approximation does not have the desired spectral properties—case "no"—a regularization step 306 is performed by scaling the singular values of the singular value decomposition of the linear approximation. Starting from a matrix that complies to the spectral restrictions of idempotent matrices, an iterative partial method 308 quickly converges to an idempotent matrix (as shown in the above-mentioned theoretical section of this document). This iterative process is stopped when the stop condition is met, 310, e.g., if the matrix is fully idempotent, i.e., if the error after sequential application of the matrix is below a given threshold value.

FIG. 4 shows a block diagram of an embodiment of the system 400 for enforcing an idempotent-constrained characteristic during training of the neural network. The system 400 comprises a neural network system 402 trainable by minimizing a loss function. Thereby, the loss function comprises an additional term imposing an idempotence-based regularization to the neural network during the training. FIG. 4 also shows optional elements of the function like: a first determination unit 404 for determining the idempotent matrix P* by determining a linear approximation of the network function; a second determination unit 406 for determining the idempotent matrix P* by determining a linear approximation of the neural network function; a third determination unit 408 for determining the linear approximation using an inverse or pseudo-inverse matrix of the input data or using the Jacobian matrix of the neural network function $f_\Theta$; a fourth determination unit for determining if the linear approximation complies with spectral restrictions of idempotent matrices, wherein the fourth determination unit is also adapted for upon determining that the linear approximation does not comply with spectral restrictions of idempotent matrices, triggering means for scaling—in particular a scaling unit 410 adapted for singular values of a Singular Value Decomposition of the linear approximation, thereby performing a regularization step on the linear approximation.

The system 400 may also comprise means for obtaining—an approximation determination unit 412 for iteratively determining an approximation to $f_\Theta$ that is more idempotent than the previous one determined by $P_{i+1} = P_i^2(3-2P_i)$ until a stop condition is met. Furthermore, the system 400 may comprise means for feeding—in particular a feedback unit adapted for feeding back—the additional term back to a back-propagation step of the training of the neural network if it is determined that the linear approximation complies with spectral restrictions and idempotence.

Embodiments of the invention may be implemented together with virtually any type of computer, regardless of the platform being suitable for storing and/or executing program code. FIG. 5 shows, as an example, a computing system 500 suitable for executing program code related to the proposed method.

The computing system 500 is only one example of a suitable computer system, and is not intended to suggest any limitation as to the scope of use or functionality of embodiments of the invention described herein regardless of whether the computer system 500 is capable of being implemented and/or performing any of the functionality set forth hereinabove. In the computer system 500, there are components, which are operational with numerous other general purpose or special purpose computing system environments or configurations. Examples of well-known computing systems, environments, and/or configurations that may be suitable for use with computer system/server 500 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Computer system/server 500 may be described in the general context of computer system-executable instructions, such as program modules, being executed by a computer system 500. Generally, program modules may include routines, programs, objects, components, logic, data structures, and so on that perform particular tasks or implement particular abstract data types. Computer system/server 500 may be practiced in distributed cloud computing environments where tasks are performed by remote processing devices that are linked through a communications network. In a distributed cloud computing environment, program modules may be located in both local and remote computer system storage media, including memory storage devices.

As shown in the figure, computer system/server 500 is shown in the form of a general-purpose computing device. The components of computer system/server 500 may include, but are not limited to, one or more processors or processing units 502, a system memory 504, and a bus 506 that couples various system components including system memory 504 to the processor 502. Bus 506 represents one or more of any of several types of bus structures, including a memory bus or memory controller, a peripheral bus, an accelerated graphics port, and a processor or local bus using any of a variety of bus architectures. By way of example, and not limiting, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Computer system/server 500 typically includes a variety of computer system readable media. Such media may be any available media that is accessible by computer system/server 500, and includes both volatile and non-volatile media as well as removable and non-removable media.

The system memory 504 may include computer system readable media in the form of volatile memory, such as random access memory (RAM) 508 and/or cache memory 510. Computer system/server 500 may further include other removable/non-removable, volatile/non-volatile computer system storage media. By way of example only, a storage system 512 may be provided for reading from and writing to a non-removable, non-volatile magnetic media (not shown and typically called a 'hard drive'). Although not shown, a magnetic disk drive for reading from and writing to a removable, non-volatile magnetic disk (e.g., a 'floppy disk'), and an optical disk drive for reading from or writing to a removable, non-volatile optical disk such as a CD-ROM, DVD-ROM or other optical media may be provided. In such instances, each can be connected to bus 506 by one or more data media interfaces. As will be further depicted and described below, memory 504 may include at least one program product having a set (e.g., at least one) of program modules that are configured to carry out the functions of embodiments of the invention.

The program/utility, having a set (at least one) of program modules 516, may be stored in memory 504 by way of example, and not limiting, as well as an operating system, one or more application programs, other program modules, and program data. Each of the operating systems, one or more application programs, other program modules, and program data or some combination thereof, may include an implementation of a networking environment. Program modules 516 generally carry out the functions and/or methodologies of embodiments of the invention, as described herein.

The computer system/server 500 may also communicate with one or more external devices 518 such as a keyboard, a pointing device, a display 520, etc.; one or more devices that enable a user to interact with computer system/server 500; and/or any devices (e.g., network card, modem, etc.) that enable computer system/server 500 to communicate with one or more other computing devices. Such communication can occur via Input/Output (I/O) interfaces 514. Still yet, computer system/server 500 may communicate with one or more networks such as a local area network (LAN), a general wide area network (WAN), and/or a public network (e.g., the Internet) via network adapter 522. As depicted, network adapter 522 may communicate with the other components of the computer system/server 500 via bus 506. It should be understood that, although not shown, other hardware and/or software components could be used in conjunction with computer system/server 500. Examples include (but are not limited to): microcode, device drivers, redundant processing units, external disk drive arrays, RAID systems, tape drives, and data archival storage systems, etc.

Additionally, a system 400 for enforcing an idempotent-constrained characteristic during training of a neural network maybe attached to the bus system 506.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be embodied as a system, a method, and/or a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD, and other digital optical disk formats.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disk read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on the user's computer, partly on the user's computer as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatuses, or another device to cause a series of operational steps to be performed on the computer, other programmable apparatus or other device to produce a computer implemented process, such that the instructions which execute on the computer, other programmable apparatuses, or another device implement the functions/acts specified in the flowchart and/or block diagram block or blocks.

The flowcharts and/or block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A computer-implemented method for enforcing an idempotent-constrained characteristic during training of a neural network, said method comprising:
    training a neural network by minimizing a loss function, wherein said loss function comprises an additional term determined at least in part by an idempotent matrix, the additional term imposing an idempotence-based regularization to said neural network during said training, the idempotence-based regularization guaranteeing that neural network operations applied multiple times to input data result in a same output, wherein the idempotent matrix is determined by utilizing a linear approximation of a Jacobian matrix of a neural network function associated with neural network parameters.

2. The method according to claim 1, wherein said additional term is expressed as $L_\Theta^{P*}(X)$ and is determined by:

$$L_\Theta^{P*}(X) = \|X' - XP^*\| = \|f_\Theta(X) - XP^*\|, \text{ wherein}$$

X=a matrix of vectorized input data for said neural network,

X'=a matrix of vectorized output data in a batch of said neural network, $f_\Theta$=the neural network function with the neural network parameters T, P*=the idempotent matrix that maps X to $f_\Theta$ (X') with an approximation that constrains said mapping to idempotence, and $\|\ldots\|$ is a norm.

3. The method according to claim 2, also comprising:
determining if said linear approximation complies with spectral restrictions of idempotent matrices.

4. The method according to claim 3, upon determining that said linear approximation does not comply with spectral restrictions of idempotent matrices:
scaling singular values of a Singular Value Decomposition of said linear approximation, thereby performing a regularization step on said linear approximation.

5. The method according to claim 4, also comprising:
obtaining iteratively an approximation to $f_\Theta$ that is more idempotent than a previous linear approximation.

6. The method according to claim 1, also comprising:
upon determining that said linear approximation complies with spectral restrictions and idempotence, feeding said additional term back to a back-propagation step of said training of said neural network.

7. The method according to claim 1, wherein said idempotence-based regularization is a Procrustes-based regularization.

8. The method according to claim 1, wherein a domain of an input vector to said neural network is equivalent to a domain of said output vector of said neural network.

9. A system for enforcing an idempotent-constrained characteristic during training of a neural network, said system comprising:
one or more processors;
one or more tangible storage media for storing programming instructions for execution by the one or more processors to perform a method, the programming instructions comprising instructions for:
training a neural network by minimizing a loss function, wherein said loss function comprises an additional term determined at least in part by an idempotent matrix, the additional term imposing an idempotence-based regularization to said neural network during said training, the idempotence-based regularization guaranteeing that neural network operations applied multiple times to input data result in a same output, wherein the idempotent matrix is determined by utilizing a linear approximation of a Jacobian matrix of a neural network function associated with neural network parameters.

10. The system according to claim 9, wherein said additional term is expressed as $L_\Theta^{P^*}(X)$ and is determined by:

$$L_\Theta^{P^*}(X)=\|X'-XP^*\|=\|f_\Theta(X)-XP^*\|, \text{ wherein}$$

X=a matrix of vectorized input data for said neural network,

X'=a matrix of vectorized output data of said neural network, $f_\Theta$=the neural network function with the neural network parameters T, P*=the idempotent matrix that maps X to $f_\Theta(X')$ with an approximation that constrains said mapping to idempotence, and $\|\ldots\|$ is a norm.

11. The system according to claim 9, wherein the programming instructions further comprise instructions for:
determining if said linear approximation complies with spectral restrictions of idempotent matrices.

12. The system according to claim 11, wherein the programming instructions further comprise instructions for:
determining that said linear approximation does not comply with spectral restrictions of idempotent matrices; and based on the determining,
scaling singular values of a Singular Value Decomposition of said linear approximation, thereby performing a regularization step on said linear approximation.

13. The system according to claim 12, wherein the programming instructions further comprise instructions for:
obtaining iteratively an approximation to $f_\Theta$ that is more idempotent than a previous linear approximation.

14. The system according to claim 9, wherein the programming instructions further comprise instructions for:
feeding said additional term back to a back-propagation step of said training of said neural network if it is determined that said linear approximation complies with spectral restrictions and idempotence.

15. A computer program product for enforcing an idempotent-constrained characteristic during training of a neural network, said computer program product comprising one or more computer readable storage media having program instructions embodied therewith, said program instructions being executable by one or more computing systems or controllers to cause said one or more computing systems to:
train a neural network by minimizing a loss function, wherein said loss function comprises an additional term determined at least in part by an idempotent matrix, the additional term imposing an idempotence-based regularization to said neural network during said training, the idempotence-based regularization guaranteeing that neural network operations applied multiple times to input data result in a same output, wherein the idempotent matrix is determined by utilizing a linear approximation of a Jacobian matrix of a neural network function associated with neural network parameters.

* * * * *